United States Patent [19]
Jansen

[11] Patent Number: 4,974,543
[45] Date of Patent: Dec. 4, 1990

[54] APPARATUS FOR AMORPHOUS SILICON FILM

[75] Inventor: Frank Jansen, Walworth, N.Y.

[73] Assignee: Xerox Corporation, Stamford, Conn.

[21] Appl. No.: 834,721

[22] Filed: Feb. 28, 1986

[51] Int. Cl.⁵ .............................................. C23C 16/50
[52] U.S. Cl. .................................................... 118/723
[58] Field of Search ................................. 118/715, 723

[56] References Cited

U.S. PATENT DOCUMENTS

| | | | |
|---|---|---|---|
| 4,223,048 | 9/1980 | Engle | 118/723 |
| 4,333,814 | 6/1982 | Kuyel | 204/298 |
| 4,369,205 | 1/1983 | Winterling et al. | 427/39 |
| 4,430,959 | 2/1984 | Ebata | 118/730 |
| 4,450,787 | 5/1984 | Weakliem et al. | 118/723 |
| 4,513,422 | 4/1985 | Jansen | 427/39 |
| 4,513,422 | 4/1985 | Jansen | 427/39 |
| 4,526,805 | 6/1985 | Yoshizawa | 427/38 |
| 4,625,678 | 12/1986 | Shioya | 118/725 |
| 4,668,365 | 5/1987 | Foster | 427/39 |
| 4,668,365 | 5/1987 | Foster | 427/39 |
| 4,673,586 | 6/1987 | White | 118/715 |
| 4,714,594 | 12/1987 | Mircea | 118/730 |

OTHER PUBLICATIONS

"Amorphous Silicon Hydrogen Alloys Produced Under Magnetic Field", Taniguchi et al., Journal of Non-Crystalline Solids, vols. 35 and 36 (1980), pp. 189-194.

"The Effect of Static Electric and Magnetic Fields on etc...", Dias et al., Thin Solid Films, 89 (1982), pp. 307 to 313.

"DC Magnetron Glow Discharge Amorphous Silicon", Smith, G. B. et al., Solar Energy Materials, (1984), pp. 45-56.

"Novel Deposition Technique of a-Si: H-Silane Glow Discharge in Magnetic Field", Hamasaki et al., Japanese Journal of Applied Physics, vol. 20 (1981), Supplement 20-1, pp. 281-285.

*Primary Examiner*—Richard Bueker
*Attorney, Agent, or Firm*—Judith L. Byorick; Eugene O. Palazzo

[57] ABSTRACT

An apparatus for preparing plasma deposited films comprised of a first electrode means; a second counterelectrode means; a receptable means for the first electrode means, and the second counterelectrode means; a substrate means to be coated contained on the first electrode means, which electrode means has contained therein permanent magnets; a gas inlet means; and a gas exhaust means, wherein a silane gas is introduced into the receptacle in a crossflow direction perpendicular to the axis of the cylindrical member.

30 Claims, 3 Drawing Sheets

APPARATUS FOR AMORPHOUS SILICON FILM

BACKGROUND OF THE INVENTION

This invention generally relates to a process and apparatus for accomplishing the preparation of thin solid films; and more specifically the present invention is directed to an improved process and apparatus for formulating hydrogenated amorphous silicon photoresponsive imaging member by plasma deposition or glow discharge techniques. In one embodiment the present invention envisions an improved apparatus and process for the preparation of a hydrogenated amorphous silicon photoresponsive imaging member by the rapid plasma deposition of amorphous silicon on a cylindrical substrate with magnets therein by subjecting an appropriates gas source material such as a silane gas to decomposition by an electrical discharge subsequent to permitting the gas to flow toward the cylindrical substrate, preferably in a crossward direction or in a direction orthogonal to the cylinder substrate axis. Incorporation of magnets into the cylinder or electrode component contained in the vacuum chamber enables a more efficient, economical, and uniform deposition of hydrogenated amorphous silicon. Additionally, with the process and apparatus of the present invention there is achieved deposition of hydrogenated amorphous silicon in a rapid sequence, that is, for example in some instances there is a doubling of the deposition rate as compared to some prior art processes. Thereafter, the cylindrical substrate containing on its surface deposited hydrogenated amorphous silicon is removed from the vacuum chamber, and can be selected as a photoconductor for incorporation into electrostatographic imaging apparatuses inclusive of electrostatic imaging and printing devices.

Electrostatographic imaging processes with photoresponsive or photoconductive materials are well known. Examples of photoconductors selected include amorphous selenium, alloys of selenium such as selenium tellurium, selenium arsenic, and the like. Additionally, layered photoresponsive imaging members can be selected for electrostatic imaging systems including those containing therein photogenerating substances and charge transport molecules, reference for example U.S. Pat. No. 4,265,990, the disclosure of which is totally incorporated herein by reference. Additionally, the use of hydrogenated amorphous silicon as a photoreceptor material is illustrated in the prior art. Apparently, hydrogenated amorphous silicon possesses a number of advantages in comparison to, for example, amorphous selenium-based materials in that amorphous silicon is of extreme hardness and will not crystallize over extended time periods, even at temperatures as high as several hundred degrees Centigrade. Additionally, amorphous silicon photoconductors have excellent photoelectric properties, high absorption coefficients through the visible region, and are relatively low in useful life cost in comparison to selenium photoconductors, for example. Moreover, amorphous silicon members are capable of ambipolarity as they can be xerographically charged and discharged either positively or negatively in various imaging systems. Further, amorphous silicon can be modified by adding various dopants thereto, such as boron and phosphorus enabling this material to function as p on n type semiconductor devices. Also, amorphous silicon may be alloyed with other elements, such as germanium and tin for the purpose of providing a material which will be photosensitive in the infrared region.

Hydrogenated amorphous silicon, which is classified as a tetrahedrally bonded amorphous semiconductor, can be prepared by known thermal evaporation techniques similar to those selected for the preparation of selenium photoconductor. However, amorphous silicon prepared in accordance with such a process usually has a relatively high dark conductivity, about $10^{-3}$ ohm-cm$(^{-1})$, thereby causing the disappearance of any charge from the surface thereof resulting in a substantially useless member for xerographic imaging purposes. Amorphous silicon prepared by the grow discharge of the gas silane results in a material having a much lower conductivity, such as below $10^{-9}$ ohm-cm$(^{-1})$ reference for example the *Journal of Electrochemical Society*, vol. 116, page 77, (1969), Chittick et al; and the *Journal of Noncrystallline Solids*, Volume 3, pages 255–270, (1970), Chittick et al.. Apparently, in these processes, hydrogen atoms saturate dangling silicon bonds and remove the band gap states causing the Fermi level to move towards mid-gap.

It is believed that the dangling bonds intrinsically incorporated in amorphous silicon can be reduced, and to some extend, controlled by the choice of film deposition conditions. These dangling bonds are apparently present in a density of sufficient magnitude to render films of amorphous silicon prepared by thermal evaporation techniques or sputtering processes unsuitable for semiconductor and photoelectronic purposes. For example, the resulting material cannot be successfully doped and used to produce p or n type operative devices. Further, intrinsic dangling bonds function as recombination sites rendering the resulting film substantially useless for photoelectronic devices. In those situations wherein, for example, amorphous silicon films are prepared in the presence of a reactive gas, the undesirable localized states are removed from the band gas as a result of the intrinsic dangling bond defects being coordinated with fragments of the reactive gas. Examples of reactive gases selected for coordination with the intrinsic silicon dangling bonds include hydrogen gas and fluorine gas.

Accordingly, thermally evaporated silicon generally must contain, for example, hydrogen or fluorine in order to be useful as a photoconductive member. Thus, the preparation of such a material requires processes and apparatus which are vastly different from those required for the familiar thermal evaporation techniques selected for the preparation of chalcogenides.

One known method for obtaining amorphous silicon materials is referred to in the art as the glow discharge process. In this process, the vapor deposition of a silane gas occurs by causing the gas to flow between two electrodes, one of which has a substrate contained therein. As electrical power is applied to the electrodes, the silane gas decomposes into a reactive silicon hydrogen species, which will deposit as a solid film on both electrodes. The presence of hydrogen can be of critical importance since it tends to coordinate with the dangling bonds in the silicon in part, as the mono, di, and trihydrides, thereby serving to passivate these dangling bonds.

Accordingly, thermally evaporated silicon generally must contain, for example, hydrogen fo fluorine in order to be useful as a photoconductive member. Thus, the preparation of such a material requires processes and apparatus which are vastly different from those required for the familiar thermal evaporation techniques selected for the preparation of chalcogenides.

One known method for obtaining amorphous silicon materials is referred to in the art as the glow discharge process. In this process, the vapor deposition of a silane gas occurs by causing the gas to flow between two electrodes, one of which has a substrate contained thereon. As electrical power is applied to the electrodes, the silane gas decomposes into a reactive silicon hydrogen species, which will deposit as a solid film on both electrodes. The presence of hydrogen can be of critical importance since it tends to coordinate with the dangling bond in the silicon in part, as the mono, di, and trihydrides, thereby serving to passivate these dangling bonds.

In another known process, amorphous silicon can be prepared by a sputtering technique wherein a substrate is attached to one electrode, and a target of silicon is placed on a second electrode. These electrodes are connected to a high voltage power supply and a gas which is usually a mixture of argon, and hydrogen is introduced between the electrodes to provide a medium in which a glow discharge or plasma can be initiated and maintained. The glow discharge provides ions which strike the silicon target, and cause the removal by momentum transfer of mainly neutral target atoms, which subsequently condense as a thin film on the substrate electrode. Also, the glow discharge functions to activate the hydrogen causing it to react with the silicon, and be incorporated into the deposited silicon film. The activated hydrogen also coordinates with the dangling bonds of the silicon to form mono, di, and trihydrides.

There is also known an apparatus and process for preparing amorphous silicon films on a substrate, which involves means for directing and accelerating an ion beam from a plasma toward a sputtering target contained within a chamber, which chamber also contains a shield means having a low sputtering efficiency compared to the sputtering target. The shield means is situated between stray ion beams and the vacuum chamber surface. More specifically, the ion beam process involves producing semiconductive films on a substrate comprising generating the plasma; directing and accelerating an ion beam of the plasma toward a sputtering target, the target being contained in a vacuum chamber at reduced pressure; shielding the vacuum chamber surface from stay ion beams, whereby sputtering of the vacuum chamber surface by the plasma is minimized, followed by sputtering the target with the ion beam to sputter the target material; and collecting the sputtered target material as a film on the substrate, the substrate being physically isolated from the plasma generating process and the sputtering process.

While the latter processes may be suitable for their intended purposes, they suffer from a number of disadvantages, including for example, very low rates of material deposition, the inability to obtain uniform coatings over large areas, and the inability to form multilayers without moving or removing the target and/or the substrate.

Additionally, there is disclosed in U.S. Pat. No. 4,265,991 an amorphous silicon photoconductor. This patent describes several processes for preparing amorphous silicon. In one process, there is prepared an electrophotographic photosensitive member which involved heating the electrophotographic member contained in a chamber to temperature of 50° C. to 350° C., introducing a gas containing a hydrogen atom into the deposition chamber, causing an electrical discharge in the space of the deposition chamber in which a silicon compound is present, by electric energy to ionize the gas, followed by depositing amorphous silicon on the electrophotographic substrate at a rate of 0.5 to 100 Angstroms per second by utilizing an electric discharge while raising the temperature of the substrate thereby resulting in a amorphous silicon photoconductive layer of a predetermined thickness.

Further, there is illustrated in U.S. Pat. No. 4,513,022, the disclosure of which is totally incorporated herein by reference, a process and apparatus for formulating hydrogenated amorphous silicon photoconductive members. Thus, there is described in this patent an apparatus for preparing hydrogenated amorphous silicon imaging members comprised of a first electrode means; a second counterelectrode means; a receptable means for the first electrode means and the second counterelectrode means; a substrate means to be coated contained on the first electrode means; which substrate is in the form of a cylindrical member, a gas inlet means, and a gas exhaust means, wherein a silane gas is introduced into the receptable in a crossflow direction perpendicular to the axis of the cylindrical member. The process and apparatus of the present application is similar to that disclosed in the aforementioned patent with the primary exception that with the apparatus of the present application there is included in the cylindrical member permanent magnets thereby permitting the advantages as detailed hereinbefore inclusive of increased deposition rates for the hydrogenated amorphous silicon.

Therefore, there is a need for improved processes and apparatuses for obtaining new films of photoconductive amorphous silicon at increased deposition rates over large areas. Additionally, there continues to be a need for improved processes and apparatuses for formulating hydrogenated amorphous silicon photoconductive members which processes and apparatuses are simple in design, economically attractive and which are susceptible to a batch process. Also, there is a need for processes and apparatuses for obtaining hydrogenated amorphous silicon at deposition rates of greater than 1 micron per hour, and wherein there results uniformity in thickness. Further, there is a need for a more efficient economical process for the preparation of hydrogenated amorphous silicon photoconductive imaging members. Moreover, there continues to be a need for processes and apparatuses for preparing amorphous silicon photoconductive structures having superior mechanical strength, improved chemical stability, and substantially no toxicity problems associated therewith. Further, there continues to be a need for improved processes and apparatuses for obtaining amorphous silicon photoconductors wherein the thickness of the resulting film on a substrate will be axially and radially uniform over a variety of operating conditions. Also, there continues to be a need for improved processes and apparatuses for obtaining amorphous silicon photoconductors wherein virtually all the silane source gas material is converted to amorphous silicon. Additionally, there continues to be a need for improved apparatus for the deposition of amorphous silicon photoconductors, wherein the apparatus can be easily and expeditiously cleaned between depositions to avoid a buildup of material in the deposition chamber. Finally, there continues to be a need for a process and an apparatus which are suitable for the deposition of amorphous silicon and related materials on numerous cylindrical substrates contained in one deposition apparatus such as a vacuum chamber.

SUMMARY OF THE INVENTION

It is an object of the present invention to provide an apparatus and process which overcomes some of the above-noted disadvantages.

In a further object of the present invention there is provided an improved process and apparatus for formulating hydrogenated amorphous silicon films in an economical, efficient manner.

Also, in a further object of the present invention there is provided an apparatus and process wherein there is incorporated into an electrode on cylinder present in a glow discharge deposition vacuum chamber magnets thereby enabling increased deposition rates of hydrogenated amorphous silicon.

Additionally, there is provided in accordance with the present invention an apparatus for obtaining hydrogenated amorphous silicon photoreceptor films of a uniform thickness at high deposition rates, that is, exceeding 1 micron per hour, which apparatus is simple in design and economically attractive.

Furthermore, in another object of the present invention there is provided an improved apparatus and process for obtaining hydrogenated amorphous silicon films with photoconductive properties for extended periods of time by introducing the appropriate into a vacuum chamber and affecting the plasma decomposition thereof between two electrodes, one or both of which has incorporated therein magnets.

In still an additional object of the present invention there are provided improved apparatuses and processes for the fabrication of multiple amorphous silicon photoconductive imaging members with substantially identical properties and characteristics.

These and other objects of the present invention are accomplished by the provision of a process and apparatus for obtaining hydrogenated amorphous silicon photoreceptors with an apparatus containing therein two electrodes, one or both of which include magnets therein. More specifically, the apparatus of the present invention is comprised of a first electrode substrate means with heating elements therein and magnets; a counterelectrode means with optional magnets; a receptable or vacuum chamber for housing the first electrode means, and the counterelectrode means wherein the first electrode means also includes a substrate or workpiece which may be in the form of a cylindrical member or drum; an entrance means, an exhaust means and a receptable for a silane gas. Alternatives to the apparatus of the present invention comprise a module consisting of a first electrode means with heating elements and magnets therein, a second counterelectrode means with or without magnets and a substrate contained on the first electrode means arranged in a single receptable or chamber which contains one gas inlet and one gas exit. In a further embodiment of the present invention there is provided a process and apparatus for formulating hydrogenated amorphous silicon photoconductors wherein a plurality of drums to be coated are present in one receptable, with one electrode, and no counterelectrode; and further wherein there is incorporated magnets into the electrode. These specific devices and others are described in detail hereinafter with respect to the figures, for example.

In a further specific embodiment of the present invention there is provided a process for preparing in an economical and efficient manner hydrogenated amorphous silicon photoconductors which comprises providing a receptacle containing therein a first substrate electrode means, and a second counterelectrode means; providing a cylindrical surface on the first electrode means; heating the cylindrical surface with heating elements contained in the first electrode means while causing the first electrode means to axially rotate; introducing a silane gas into a reaction vessel at a right angle with respect to the cylindrical member; applying a current to the first electrode means; and applying a current to the second electrode means, wherein the first electrode means includes therein magnets enabling the silane gas to be decomposed spatially close to the first electrode mans permitting efficient deposition of hydrogenated amorphous silicon on the cylindrical surface.

DESCRIPTION OF THE PREFERRED EMBODIMENTS

Figure 1:
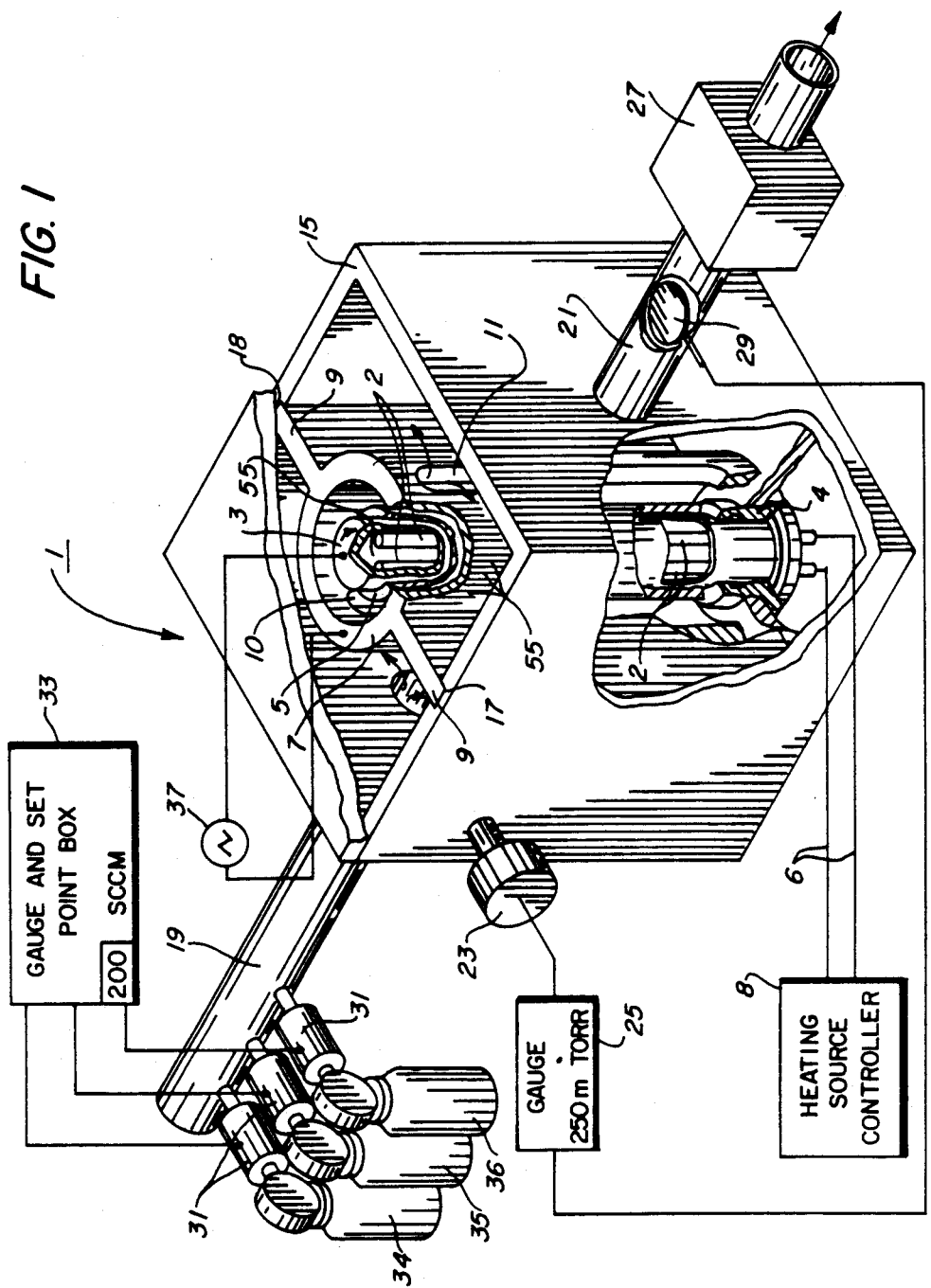

The process and apparatus of the present invention and various alternative embodiments will now be described with reference to the following Figures wherein:

FIG. 1 is a cross-sectional view of the apparatus and process of the present invention; and FIG. 2 is a cross-sectional schematic view of a further apparatus and process embodiment of the present invention. Illustrated in FIG. 1 is the apparatus and process of the present invention, generally designated 1, comprising a cylindrical first electrode means 3 rotating in the direction indicated by the arrow, which first electrode means includes permanent magnets 55 which may rotate with the first electrode means or are stationary, secured on an electrically insulating rotating shaft; radian heating elements 2 situated within the first electrode means 3; connecting wires 6; a hollow shaft rotatable vacuum feedthrough 4; a heating source 8; a hollow drum substrate 5 containing therein the first electrode means 3, the drum substrate being secured by end flanges, not shown, which are part of the first electrode means 3; a second hollow counterelectrode means 7 containing flanges thereon 9, which counterelectrode means includes permanent magnets 55 attached to the outer surface thereof; and slits or vertical slots 10 and 11; receptacle or chamber means 15 containing as an integral part thereof receptacles 17 and 18 for flanges 9 for mounting the module in the chamber 15; a capacitive manometric vacuum sensor 23; a gauge 25; a vacuum pump 27 with a throttle valve 29; mass flow controllers 31; a gauge and set point box 33; gas pressure vessels 34, 35 and 36; and a current source means 37 for the first electrode means 3, and the second counterelectrode means 7. The chamber 15 contains an entrance means 19 for the source gas material, and exhaust means 21 for the unused gas source material. By module, in accordance with the present invention, is meant that portion of the apparatus comprised primarily of the first electrode means with magnets and containing heating elements therein; and a second counterelectrode means with the drum of substrate to the coated contained on the first electrode means.

Generally, in operation the chamber 15 is vacuum evacuated by vacuum pump 27 to an appropriate pressure corresponding to the pressure desired by manually adjusting gauge 25, this pressure being measured in the chamber by the vacuum sensor 23. The pressure in the chamber 15 is automatically regulated so as to correspond to the setting specified at gauge 25 by the position of the throttle valve 29. Subsequently, a silane gas, which originates from one of the gas vessels 34, 35 or 36, is introduced into the chamber 15 through entrance means 19, the flow of the gas being controlled by the mass flow controller 31. This gas introduced into the entrance 19 in a crossflow direction, that is, the gas flows in a direction perpendicular to or at right angles to the axis of the cylindrical substrate 5 contained on the first electrode means 3. Simultaneously with the introduction of the silane gas, the first electrode means is caused to be rotated by a motor, not shown, and power is supplied to the radiant heat elements 2 by heating source 8, while current is applied to the first electrode means and the second counterelectrode means by a power source 37. Generally, sufficient power is applied form the heating source 8 that will maintain the drum 5 at a temperature ranging from about 100° C. to about 300° C., and preferably at a temperature of about 200° C. to about 250° C. The electrical field created between the first electrode means 3 and the second counterelectrode means 7 causes the silane gas entering this filed to be decomposed by glow discharge whereby amorphous silicon (a-Si:H) is deposited in a uniform thickness on the surface of cylindrical means 5 contained on the first electrode means 3. Unused silane gas exits at 21 in view of the pressure differential existing between the left side of the chamber 15 and the right side, which gas is subsequently discarded. The gauge and set point box 33 controls the amount of silane gas introduced into entrance 19, this amount generally being up to 5 liter per minute or about 2 cubic centimeters to about 200 standard cubic centimeters per minute at standard temperature and pressure operating conditions. An important purpose for slits 10 and 11 is to maintain the silane gas in a crossflow direction.

More specifically, in one operation sequence, chamber 15 is evacuated to a base pressure of less than 1 mTorr (milliTorr), and subsequently a silane gas is introduced into the chamber 5 from gas pressure vessel 34; or a silane gas mixed with other dopant gases such as diborane or phosphine are introduced into the chamber from gas pressure vessels 34, silane gas; 35, diborane; and 36, phosphine. Further, the silane gas can be introduced into the reaction chamber as alloy gases with ammonia or hydrocarbons as detailed herein. The flow rate of the gas being introduced is controlled by the mass flow controller 31 which flow rate is equivalent to the numerical readout specified in the gauge and set point box 33. This flow rate ranges from about 2 cubic centimeters per minute to about 5 liters per minute, normalized per module. The pressure of the silane gas or mixtures thereof in the vacuum chamber 15 is controlled as desired with the vacuum sensor 23, vacuum gauge 25, vacuum pump 27 and throttle valve 29 by setting the pressure desired at gauge 25. This pressure generally ranges from 100 to about 5000 mTorr, however, in the operational sequence being illustrated, the pressure is 250 mTorr.

The first electrode 3 is caused to rotate at a speed of from about one rotation per minute to about ten rotations per minute by a motor not shown. In this illustrative embodiment, the first electrode means 3 and the counterelectrode means 7 are connected to terminals of power source 37, of direct current, alternating current, radio frequency, microwave, or the like. Thus, there can be applied to the electrode 3 by direct current a voltage of from about 10 volts to about 2,000 volts, while the counterelectrode is at ground potential, that is, 0 volts. This creates an electrical field situated between the first electrode means 3 and the counterelectrode means 7.

Simultaneously with the introduction of the silane gas or mixture thereof into chamber 15, the drum surface 5 from which a magnetic field emerges on a direction perpendicular to the surface of the drum, is heated to a temperature of about 230° C. by heating elements 2. Subsequently, the silane gas or mixture thereof entering the electric and magnetic field in a crossflow direction is decomposed by a gas discharge or plasma resulting in silicon species, and hydrogen specifies which deposit on the surface of drum 5 and on the inside of the counterelectrode 7. The gas discharge or plasma formed between the two electrodes contains ions and electrons, neutral radicals, silane, or silane and dopants such as diborane and phosphorus molecules. Thereafter, and after a sufficient amount of amorphous silicon has deposited on the substrate of cylindrical means 5, the system is inactivated and the amorphous silicon coated cylindrical drum is removed from the chamber 15. Should it be desired to prepare other amorphous silicon members, there is then inserted into the chamber 15 and in contact with the first electrode means 3 an uncoated cylindrical means 5 followed by reactivation of the system described. The cylindrical coated amorphous silicon means removed from the chamber is then suitable for use as a photoconductive element in, for example, an electrostatographic imaging process.

The first electrode means 3 can be of any one of a different number of configurations, but preferably is in the form of a cylinder with an overall diameter being from about 3 inches to about 15 inches. Generally, this electrode means, which is connected to a voltage source, is a solid member comprised of numerous suitable materials such as stainless steel, steel, invar, aluminum, ceramic materials or glassy materials, and the like, with stainless steel being preferred.

the electrode means 3 is secured to the chamber 15 by an electrically insulating shaft or a hollow shaft rotatating vacuum feedthrough 4, which is commercially available from Ferrofluids Corporation. The shaft is caused to rotate at a speed of from about 1 rotation per minute to about 10 rotations per minute by a power source such as a motor, not shown, which causes the first electrode means 3, and the cylindrical means 5 to rotate at substantially the same speed.

The first electrode means 3 is as illustrated contained in a rotatable hollow cylindrical means 5, which is in physical contact with the first electrode means. The cylindrical drum means is secured to the first electrode means 3 by demountable end flanges situated at the top portion and bottom portion, not shown, of the first electrode means assembly. The cylindrical means 5, which provides a supporting substrate for the deposition of the silane gas, or mixtures of silane gases, can be comprised of numerous suitable substances including aluminum, nickel, polymeric compositions such as polyimides, stainless steel, and the like; with aluminum being preferred.

Also, of importance with respect to the present invention are the magnets 55 contained in the first cylindrical means 3, or second counterelectrode means 7, as shown. These magnets can be selected from a number of numerous suitable known materials such as ceramics, nickel-iron-cobalt alloys, electromagnets, and the like. Generally, there are present sufficient magnets to enable the objectives of the present invention to be achieved; however, in one process embodiment, from about 25 magnetic poles to about 250 magnetic poles, preferably in an array or systematically stacked in columns, are selected for the electrode means 3, and the counterelectrode means 7, which magnets create a magnetic field of about 3,000 to about 4,000 Gauss. Further, these magnets are permanently attached to a holder by various suitable known means such as, for example, mechanical clamping and embedding.

Although it is not desired to be limited by theory, it is believed that the magnets enable a more efficient and economical apparatus and process for formulating hydrogenated amorphous silicon imaging members. Furthermore, with these magnets there can be obtained hydrogenated amorphous silicon at increased deposition rates. For example, presently hydrogenated amorphous silicon is deposited at between 1 to 10 microns per hour. In contrast, with the invention of the present application the amorphous silicon can be deposited in amounts of from about 20 to 50 microns per hours. Apparently, the magnets enable the radicals formed between the two electrodes to be in closer proximity to the first electrode means rather than therebetween or closer to the anode electrode means, thereby enabling more rapid deposition of the hydrogenated amorphous silicon therefrom. Furthermore, the radicals formed during the plasma deposition, since they are in closer proximity to the first electrode means, do not undesirably exit from the system causing them to be unavailable for deposition of hydrogenated amorphous silicon.

More specifically, in a direct current discharge the condensable radicals are formed from the silane gas by electron impact disassociation of the gas molecules. The electrons originate from the cathode, which is generally the workpiece or substrate as illustrated in U.S. Pat. No. 4,513,022. Without magnets, the electrons are accelerated away from the workpiece by the electric field applied between the two electrodes, the workpiece and a counterelectrode. The condensable radicals are, therefore, formed away from the surface at which they should condense, negatively affecting the deposition rate and the efficiency of the deposition process. In accordance with the present invention, the application of a magnetic field with magnetic components along the direction of the electric field, causes the electrons to execute a spiral-like motion when traversing across the electrode space. Further, the radius of the circular component is inversely proportional to the magnetic field and the orbiting frequency is proportional to the magnetic field strength. Also, the electron traverses a relatively long distance in close proximity to the cathode when a magnetic field is applied enhancing the probability of a collision with a gas molecule close to the cathode. As the activated gas molecules only have to travel over relatively short distances to the cathode, the deposition rate and the deposition efficiency are both increased compared to the situation where no such magnetic field was applied.

The magnets 55 can be incorporated into either or into both electrodes 3 and 7. Also, it is advantageous to have the drum substrate move with respect to the magnetic field in such a way that every part of the substrate is exposed to the same magnetic flux. In practice, the magnets are held stationary while the drum substrate rotates.

Magnets selected are preferably permanent although electromagnets can be used. The application of a magnetic field to enhance the deposition rate of a flow discharge or plasma enhanced chemical vapor deposition (PECVD) process is most beneficial when dc voltages are present in the discharge, that is the voltage applied between the electrodes is a dc voltage; or alternatively, the electrodes are connected to a high frequency power supply and a dc component results form the selfbiasing of the discharge. Also, the deposition of amorphous silicon photoreceptor devices can be entirely accomplished with a dc discharge, wherein the magnetic field lines are in parallel to the electric field lines between the two electrodes 3 and 7.

the beneficial effect of the magnetic field on the deposition rate and the efficiency of the process is understood, although it is not desired to be limited by theory from the way in which the discharge can be sustained; and the way in which condensable particles are created that contribute to the formation of the hydrogenated amorphous silicon. Thus, it is believed that secondary electrons are continuously emitted from the cathode and accelerated in the electric field between the two electrodes, and condensable neutral radicals and ions are created by the collisions between the fast electrons and the gas molecules. The radicals condense on the substrate to form the hydrogenated amorphous silicon and the ions are accelerated towards the cathode where, through the high energy of the impact, the secondary electrons are created. By the application of a magnetic field with magnets 55 parallel to the electric field, the secondary electrons do not traverse in a straight line across the electrode gap. Rather, a spiraling electron motion is accomplished with a velocity component in the direction of the electric filed as well as perpendicular to the electric filed lines. In this way, the electron collides with the gas molecules much closer to the substrate than when a magnetic field is not applied. Therefore, condensable radicals are created close to the substrate enhancing the deposition rate. Additionally, due to the increased probability that the electrons ionize a gas molecule, the discharge can be operated at a lower pressure, which enhances the material efficiency of the plasma deposition process.

The hydrogenated amorphous silicon is generally deposited on the cylindrical drum means in a thickness of from about 5 microns to about 60 microns; and preferably in a thickness of from about 20 microns to about 30 microns. Furthermore, the amorphous silicon deposited contains from about 5 weight percent to about 35 weight percent of hydrogen, and from about 65 weight percent to about 95 weight percent of silicon together with, in some instances, small amounts of appropriate dopants such as boron and phosphorus.

With further respect to the present invention, the first electrode means 3 and cylindrical drum means 6 are contained in a hollow second electrode means 7 comprised of, for example, stainless steel containing flanges thereon. Generally, the second electrode means has a length of from about 9 inches to about 20 inches, and has a diameter of rom about 4 inches to about 16 inches. Electrodes with other size ranges can be selected providing the objectives of the present invention are achieved, the size of this electrode being dependant, for example, on the dimensions of the first electrode and the dimensions of the cylindrical drum means 5. The flanges 9, which extend for the entire length of the second counterelectrode means 7, are permanently attached thereto; the primary purpose of these flanges being for securement of the module to the chamber means 15. Also, as these flanges are mounted in the entrance slot 17, they function to retain the gas source in the vacuum chamber as illustrated.

The flow of the silane gas source in an important parameter of the present invention, this flow being specified herein as a crossflow. This crossflow direction provides for the uniform deposition of amorphous silicon in essentially an identical thickness on the entire drum surface since radial thickness uniformity is warranted by drum rotation, and axial thickness is a result of the axially uniform gas flow pattern. Also, the silane gas entering into the reaction chamber is decomposed by the field established between in the first electrode means, and the second counterelectrode means. This field is established as a result of the connection of the terminals of an electrical power supply to the first and second electrode. This power supply is of the direct current type. The second electrode means can be at the same electrical potential as the chamber means 15.

Electric fields contained between the electrodes are from about 10 volts/inch to about 10,000 volts/inch, and preferably are from about 250 volts/inch to about 1,500 volts/inch; however, this field can be varied as desired providing the objectives of the present invention are accomplished.

Chamber means 15 serves as a container for the module and is generally comprised of stainless steel, sealed with demountable covers which serve as access means. This container is of a sufficient dimension so as to allow the module to reside therein. Generally, the container is of a height of from about 10 inches to about 30 inches, and has a width of from about 5 inches to about 17 inches.

Gas inlet entrance means 19 allows for the introduction of, for examples, the silane gas to be decomposed, this gas originating from a cylinder. Examples of such gases include $SiH_4$ and $Si_2H_6$. Additionally, the selected hydrosilicon gas may be mixed with doping materials such as diborane, $B_2H_6$ originating from gas vessel 35, and/or phosphine, $PH_3$ originating from gas vessel 36, added in amounts ranging from about 1 part per million to about 100 parts per million by volume. The borane dopant is for the primary purpose of producing a p-type material, while the phosphine gas allows the production of an n-type material.

Additionally, the gas is introduced in a crossflow direction at approximately a 90° angle relative to the cylindrical drum being coated. Another inlet may be provided for the introduction of other gases including oxygen or nitrogen, water vapor or hydrocarbon gases; or a combination of these gases with the introduction of $SiH_4$, $Si_2H_6$ for the purpose of improving the properties of the deposited layer. Thus, the photosensitivity and dark discharge properties of the deposited amorphous silicon can be improved with the addition of these other gases.

Moreover, in accordance with the process and apparatus of the present invention, there can be prepared layered members such as those members comprised of amorphous silicon containing thereover a coating of silicon nitride or silicon carbide. This is accomplished by initially depositing amorphous silicon containing thereover a coating of silicon nitride or silicon carbide by initially depositing amorphous silicon on the cylindrical drum surface 5, followed by the deposition of silicon nitride by introducing a mixture of a silane gas with ammonia in a ratio of 1 part silane gas to about 3 parts of ammonia, followed by the deposition of silicon carbide from mixtures of silane and methane, or silane and ethylene. The thickness of the second layer, the silicon nitride or silicon carbide layer, ranges from about 0.1 microns to about 1.0 micron.

Figure 2A:
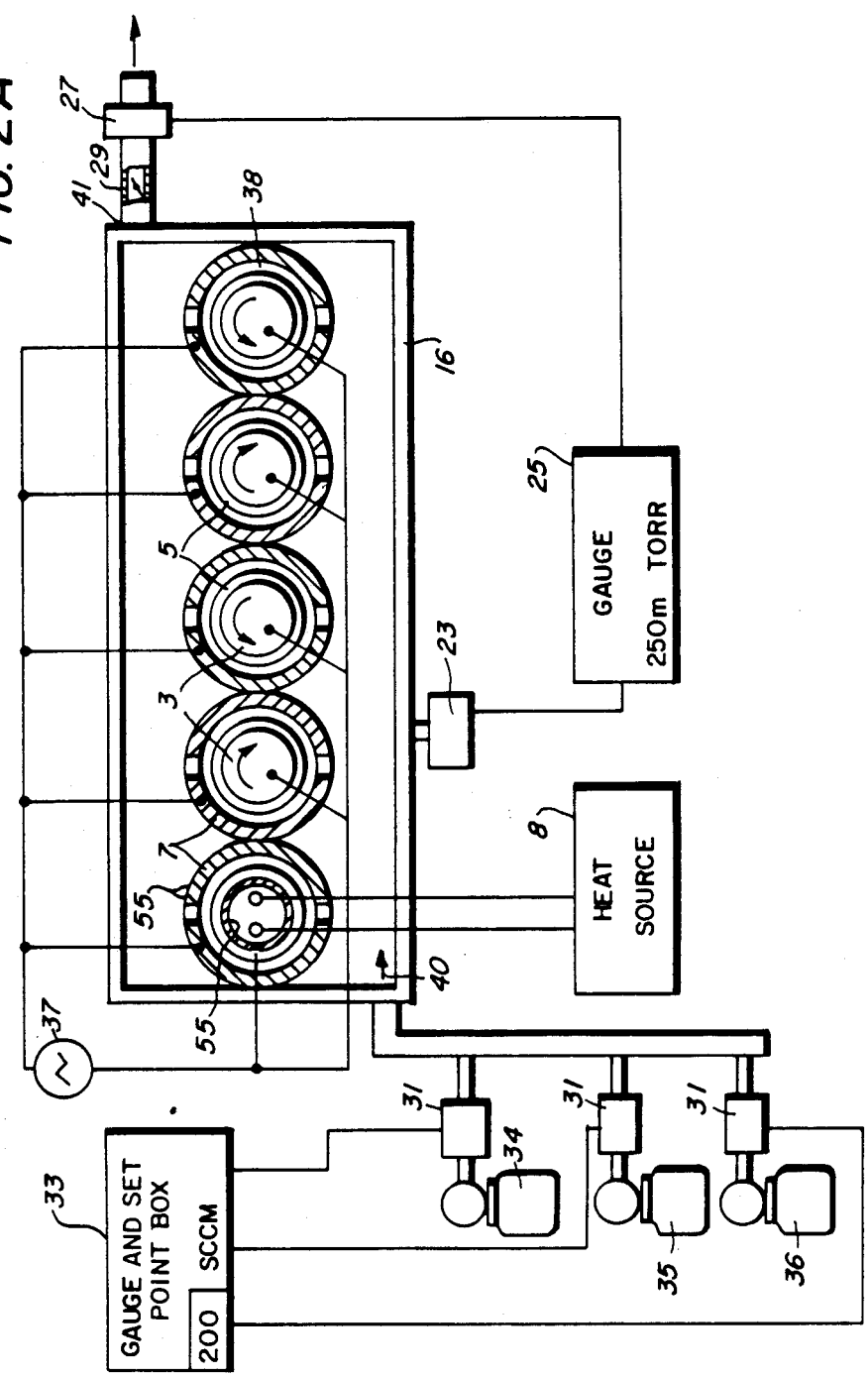
Figure 2B:
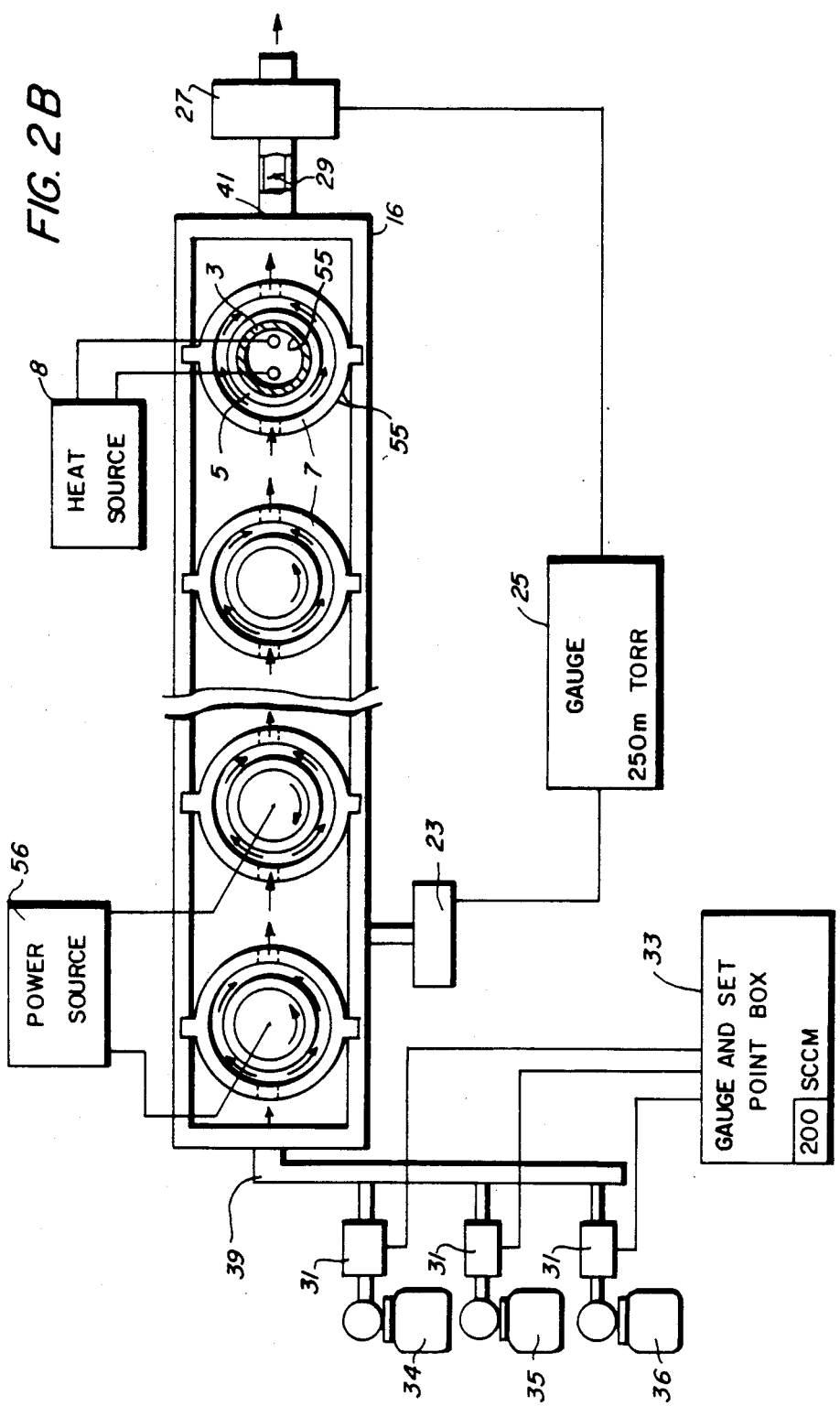

Illustrated in FIG. 2 is a further process and apparatus embodiment of the present invention with modules either in series, reference FIG. 2a, or parallel, reference FIG. 2b, which modules are contained in one reaction chamber 16. Each of the cylindrical drums included in the module have permanently attached thereto magnets 55 as illustrated herein with reference to FIG. 1.

More specifically, there is illustrated in FIG. 2, where like numerals represent the same components as illustrated in FIG. 1, a series of modules or modules in parallel comprised of a first electrode means 3, a cylindrical drum 5, a counterelectrode means 7 containing flanges 9 thereon and slits therein, 10 and 11, not labeled, and magnets 55. The devices at illustrated in FIG. 2a and 2b contain other components, some of which are not labeled in these cross-sectional views, identical to the components in FIG. 1, including a vacuum sensor 23, gauge 25, vacuum pump 27, throttle valve 29, mass flow controller 31, gauge and set point box 33, electrical power source 37, radiant heating elements 2, wires 6, hollow shaft rotatable vacuum feedthrough 4, heating source 8, gas pressure vessels 34, 35 and 36, and exhaust means 41. There is further illustrated in these figures an electrical field 38.

With further reference to FIGS. 2a and 2b hydrogenated, about 10 to 50 atomic percent of hydrogen, amorphous silicon is deposited on the rotating cylindrical drum surfaces 5 in accordance with the details provided herein with reference to FIG. 1. The apparatus, as illustrated in FIG. 2a and 2b, includes numerous cylindrical drums which can be coated simultaneously with silane gas, or a mixture of silane gas wit other gases, by introduction into the chamber 15 through entrance means 39. The flow rate of the silane gas introduced into the chamber 15 is the flow rate per module, as described with reference to FIG. 1, multiplied by the number of modules present in the container 15; thus the flow rate of the silane gas for coating the five modules, as illustrated in FIG. 2, would be approximately 1,250 standard cubic centimeters per minute.

With further reference to FIG. 2, the silane gas is directed to a crossflow direction, perpendicular to the drum substrate, being coated as illustrated by the arrow 40 depicting the flow of the silane gas. One advantage of the apparatus of FIG. 2, in comparison to FIG. 1, is that a series of drums can be coated simultaneously with the apparatus of FIG. 2 while only one drum may be coated with the apparatus of FIG. 1. Nevertheless, the time needed for causing deposition of the coating on the drum in FIG. 1 is substantially equal to the amount of time for coating the drum of FIG. 2b since the amount and degree of coating can be controlled by altering the flow rate of the gas. Thus, in FIG. 2b, where the modules are shown in parallel, the flow rate of the gas into the vacuum chamber is substantially the same as in the situation with a single module, but multiplied by the number of modules incorporated in the vacuum chamber. In FIG. 2a, where modules are shown in series, the flow rate of the gas into the vacuum chamber is substantially the same as in the situation with a single module. In the latter situation, the efficiency of the conversion of the reactive silane gas into a photoconductive material has been substantially improved.

Additionally, with further respect to FIG. 2, the magnets 55, especially in the first electrode, enable, as with the apparatus of FIG. 1, the deposition of hydrogenated amorphous silicon on each of the substrates at increased deposition rates, that is, from about 20 to abut 50 microns per hours as compared to, for example, from between 1 to 10 microns per hours with respect to the process and apparatus illustrated in the U.S. Pat. No. 4,466,380. Also, chamber 17 can include a number of additional gas inlets, which function to provide superior and more rapid deposition of the amorphous silicon on the drum surfaces. Containers can be envisioned which will included therein numerous cylinder or drums to be coated with the number of drums to be coated being restricted only by the dimensions place on the reaction chamber. Thus, for example, it is envisioned that perhaps up to 100 drums can be coated simultaneously in such a chamber.

The coated cylindrical drums prepared in accordance with the process and apparatus, as illustrated with reference to FIG. 1 and 2, contain photoconductive amorphous silicon as evidence by x-ray diffraction, and selected area electron diffraction characterizations. Further, xerographic charging and photodischarge test indicated that the cylindrical drums contained photoconductive amorphous silicon. In these test, a surface charge is applied by a corona discharge in air to the coated cylindrical drum surface in order to create an electric field of about 20 volts/micron or greater across the amorphous silicon film. This surface charge, which is either of a positive or negative polarity, can be erased by illumination. Specifically, it was determined by analytical analysis with secondary ion mass spectrometry that the deposited thin films in this embodiment contain mainly silicon, 95 percent by weight to 65 percent by weight; and hydrogen, 8 percent by weight to 35 percent by weight. Also, with electron spin resonance techniques the paramagnetic spin density of the amorphous silicon can be measured, which density is believed to be a measure of the density of dangling or unsatisfied bonds. The measured spin density was in the order of $10^{15}$ to $10^{17} cm^{-3}$.

Furthermore, the hydrogenated amorphous silicon drums prepared in accordance with the process of the present invention were incorporated into xerographic imaging systems wherein they functioned as a photoconductor. These drums were charged to a positive polarity, exposed to an optical pattern, followed by developing the electrostatic latent image with a developer composition comprised of toner particles and carrier particles. The resulting images were then transferred to a suitable substrate and permanently affixed thereto by heat. The resulting develop images were of excellent resolution, low background, high line density, and excellent solid area coverage.

The invention will now be described in detail with respect to specific preferred embodiments thereof, it being understood that these Examples are intended to be illustrative only. Also, the invention is not intended to be limited to the materials, conditions, and process parameters recited herein. All parts and percentages are by weight unless otherwise indicated.

EXAMPLE I

The apparatus of FIG. 1 was evacuated to pressures of less than $1 \times 10^{-4}$ Torr, and the combined inleak and outgassing rate was typically smaller than 0.1 standard cubic centimeter per minute. Nitride grade silane gas, available from Air Products, was introduced in the apparatus in a crossflow direction at a flow rate of 200 standard cubic centimeters per minute. The Roots/mechanical pump combination of the apparatus was throttled so as to produce a pressure of 250 mTorr at these flow rates. The pressure was held constant by a closed loop pressure control apparatus connected between the capacitance nanometer and the throttle valve. Discharge was initiated in the annular space situated between a first stainless steel electrode, and a second steel electrode counterelectrode by applying a DC voltage of about 750 volts to these electrodes causing the first electrode containing an aluminum drum, with magnets 55 permanently attached thereto, to have a negative polarity with respect to the second counterelectrode which is grounded. The distance between the first electrode and the second electrode was about 1 inch.

The stationary array of permanent magnets 55 was constructed form ½ inch diameter ceramic magnets with a nominal magnetic field strength of 3,000 Gauss. The magnets were lined in rows of 32 each and contained in a water cooling jacket. Six of these rows were equally spaced around the inside diameter of the mandrel. Each row was separated from the other by a stationary 500 W heating element.

Power was then supplied to the heating elements contained in the first electrode in order to maintain the temperature of the cylindrical aluminum drum to be coated at 250° C. Additionally, the first electrode containing the aluminum cylinder thereon was rotated by an external motor drive at a speed of 1–2 revolutions per minute. The cylindrical aluminum drum being coated has a surface area of about 1,000 cm², thus the current drawn is about 100 milli-ampers which was held constant throughout the deposition process.

A uniform film of hydrogenated amorphous silicon, 10 atomic percent of hydrogen, was deposited on the aluminum substrate in a thickness of 20 microns in about one hour, that is, the deposition rate was 20 microns per hour.

The amorphous silicon aluminum drum thus prepared was incorporated into a xerographic imaging system wherein there was formed on the imaging member an electrostatic latent image. This image was then developed with a developer composition comprised of resin particles containing a styrene n-butylmethacrylate resin, 90 percent by weight, and 10 percent by weight of carbon black, and there results excellent images. Specifically, xerographic prints made with such a drum have good contrast, good line resolution, and good solid area coverage.

The coated drum accepts negative charge causing an electrical field of 20 volts per micron in the silicon film, and discharges with white light of 15 ergs/cm² at a wavelength of 4,000 to 7,000 Angstroms. This was evidenced by no measurable charge remaining of the silicon photoreceptor as determined by an electrostatic probe after a discharge time of about 1.25 seconds.

Other modifications of the present invention will occur to those skilled in the art based upon a reading of the present disclosure These are intended to be included within the scope of this invention.

What is claimed is:

1. An apparatus for preparing plasma deposited films comprised of a first electrode means having contained therein permanent magnets; a second counterelectrode means; a receptacle means for the first electrode means, and the second counterelectrode means; a rotatable cylindrical drum substrate means, having an axis perpendicular to its plane of rotation, to be coated contained on the first electrode means; a direct current power source, which power source is connected to the first electrode means and the second counterelectrode means; a gas inlet means; and a gas exhaust means, wherein a silane gas is introduced into the receptacle in a crossflow direction perpendicular to the axis of the cylindrical drum substrate means.

2. An apparatus for preparing amorphous silicon photoconductive devices comprising in operative relationship a rotating first electrode means with radiant heating elements and magnets situated therein, a heating source, and a rotatable hollow cylindrical drum member having an axis perpendicular to its plane of rotation; a second hollow counterelectrode means containing vertical slits therein; a chamber means with gas inlet means; and gas exhaust means containing the first and second electrode means therein; a vacuum sensor means; a gauge means; a vacuum pump, a mass flow controller means; a gauge and set point box means; a direct current power source means for the first electrode means and the second counterelectrode means; and gas pressure vessels wherein a silane gas is introduced into the chamber means in a crossflow direction perpendicular to the axis of the hollow cylindrical drum member.

3. An apparatus in accordance with claim 2 wherein the heating source supplies sufficient power for maintaining the hollow cylindrical drum member at a temperature ranging from about 100° C. to about 300° C.

4. An apparatus in accordance with claim 2 wherein a silane gas is introduced into the chamber at a rate of up to 5 liters per minute.

5. An apparatus in accordance with claim 2 wherein a silane gas is introduced into the chamber at a rate ranging from about 2 standard cubic centimeters per minute to about 200 standard cubic centimeters per minute.

6. An apparatus in accordance with claim 4 wherein the pressure of the silane gas introduced into the chamber ranges from about 100 mTorr to about 5,000 mTorr.

7. An apparatus in accordance with claim 2 wherein the current applied to the first electrode means ranges from about 10 volts to about 2,000 volts, and the counterelectrode means is at ground potential.

8. An apparatus in accordance with claim 2 wherein electrical field is created between the first electrode means and the second counterelectrode means, which electrical field causes deposition of the silane gas introduced into the chamber.

9. An apparatus in accordance with claim 8 wherein the electrical filed contained between the electrodes ranges from about 10 volts/inch to about 10,000 volts/inch.

10. An apparatus in accordance with claim 2 wherein amorphous silicon is deposited on the hollow cylindrical drum member in a thickness of from about 5 microns to about 60 microns.

11. An apparatus in accordance with claim 2 wherein amorphous silicon containing from about 5 weight percent to about 35 weight percent of hydrogen and from about 65 weight percent to about 95 weight percent of silicon is deposited on the hollow cylindrical drum member.

12. An apparatus in accordance with claim 2 wherein the first electrode means is comprised of stainless steel, steel, invar, aluminum, ceramic materials, or glassy materials.

13. An apparatus in accordance with claim 2 wherein the cylindrical member means is comprised of aluminum, nickel, polymeric compositions, or stainless steel.

14. An apparatus in accordance with claim 2 wherein there is further introduced into the chamber means dopant gases simultaneously with the introduction of the silane gas.

15. An apparatus in accordance with claim 14 wherein the dopant gases are borane or phosphine.

16. An apparatus in accordance with claim 15 wherein the dopant gases are added in amount ranging from about 1 part per million to about 100 parts per million.

17. An apparatus in accordance with claim 1 wherein hydrogenated amorphous silicon is deposited on the rotatable cylindrical drum substrate means at a rate of from about 20 microns per hour to about 50 microns per hour.

18. An apparatus in accordance with claim 2 wherein 25 to 250 magnetic poles are selected.

19. An apparatus in accordance with claim 2 further including magnets in the counterelectrode.

20. An apparatus in accordance with claim 1 wherein a layer of uniform thickness of amorphous silicon is deposited on the rotatable cylindrical drum substrate means.

21. An apparatus in accordance with claim 2 wherein a layer of uniform thickness of amorphous silicon is deposited on the rotatable hollow cylindrical drum member.

22. An apparatus n accordance with claim 10 wherein the amorphous silicon is deposited on the rotatable hollow cylindrical drum member n a layer having uniform thickness.

23. An apparatus in accordance with claim 18 wherein the amorphous silicon is deposited on the rotatable cylindrical drum substrate means in a layer having uniform thickness.

24. A process for preparing hydrogenated amorphous silicon photoconductors which comprises providing a vacuum chamber containing therein a first electrode means, and a second counterelectrode means; providing a cylindrical drum member on the first electrode means, which member includes permanently attached thereto magnets; heating the cylindrical drum member with heating elements contained in the first electrode means to a temperature ranging from about 100° C. to about 300° C. causing the first electrode means to axially rotate; introducing a silane gas into the chamber means at a crossflow direction with respect to the cylindrical drum member; and applying a current to the first electrode means whereby the silane gas introduced is decomposed permitting deposition of hydrogenated amorphous silicon on the cylindrical surface.

25. A process in accordance with claim 24 wherein the hydrogenated amorphous silicon is deposited in a thickness of from about 5 microns to about 60 microns.

26. A process in accordance with claim 24 wherein the hydrogenated amorphous silicon deposited contains from about 65 percent by weight to about 95 percent by weight of silicon, and from about 5 percent by weight to about 35 percent by weight of hydrogen.

27. A process in accordance with claim 24 wherein the silane gas is introduced into the chamber means at a flow rate of up to 5 liters per minute.

28. A process in accordance with claim 24 wherein the hydrogenated amorphous silicon is deposited at a rate of from about 20 to about 50 microns per hour.

29. A process in accordance with claim 24 wherein 25 to 250 magnetic poles are selected.

30. A process in accordance with claim 24 further including magnets in the counterelectrode.

* * * * *